United States Patent [19]

Harmer

[11] Patent Number: 5,281,405

[45] Date of Patent: Jan. 25, 1994

[54] OPTICALLY USEFUL COMPOSITIONS AND A SOL-GEL PROCESS FOR THEIR PRODUCTION

[75] Inventor: Mark A. Harmer, Wilmington, Del.

[73] Assignee: E. I. Du Pont de Nemours and Company, Wilmington, Del.

[21] Appl. No.: 838,589

[22] Filed: Feb. 19, 1992

[51] Int. Cl.$^5$ .................... C01B 25/26; C01G 23/00; C01G 28/02; C03C 3/00

[52] U.S. Cl. .................... 423/306; 423/598; 423/601; 423/602; 501/12; 427/126.3

[58] Field of Search ............... 423/598, 601, 602, 306; 501/12; 385/129; 359/350; 264/2.6; 372/34; 427/126.3

[56] References Cited

U.S. PATENT DOCUMENTS

| | | | |
|---|---|---|---|
| 3,949,323 | 4/1976 | Bierlein et al. | 252/62.9 |
| 4,231,838 | 11/1980 | Gier | 156/600 |
| 4,305,778 | 12/1981 | Gier | 423/305 |
| 4,704,299 | 11/1987 | Wielonski et al. | 501/12 |
| 4,740,265 | 4/1988 | Bierlein et al. | 156/624 |
| 4,761,202 | 8/1988 | Bordui et al. | 156/624 |
| 4,766,954 | 8/1988 | Bierlein et al. | 156/624 |
| 4,929,436 | 5/1990 | Legrand et al. | 423/598 |
| 4,946,710 | 8/1990 | Miller et al. | 252/62.9 |
| 4,957,725 | 9/1990 | Potember et al. | 423/592 |
| 4,997,515 | 3/1991 | Ohbayashi | 423/306 |
| 5,011,568 | 4/1991 | Braymen et al. | 156/647 |
| 5,023,071 | 6/1991 | Sherif | 423/598 |
| 5,039,187 | 8/1991 | Ballman et al. | 156/624 |
| 5,066,356 | 11/1991 | Ferretti et al. | 156/623 R |
| 5,084,206 | 1/1992 | Ballman et al. | 156/624 |
| 5,109,462 | 4/1992 | Watanabe et al. | 359/328 |
| 5,146,533 | 9/1992 | Bierlein et al. | 156/624 |

FOREIGN PATENT DOCUMENTS

| 0086022 | 5/1985 | Japan | 423/598 |
|---|---|---|---|
| 662491 | 5/1979 | U.S.S.R. | 423/306 |

OTHER PUBLICATIONS

D. C. Bradley, "Metal Alkoxides as Precursors for Electronic and Ceramic Materials", Chem. Rev., 1989, 89, pp. 1317-1322.

O. Kondo, et al., "Fabrication of $SiO_2$-$GeO_2$ Glass Optical Waveguides by the Gas-Phase Doping Method", Japanese Journal of Applied Physics, vol. 29, No. 12, Dec. 1990, pp. 2868-2874.

L. L. Hench et al., "The Sol-Gel Process", Chem. Rev., 1990, 90, pp. 33-72.

D. P. Partlow et al., "Properties and Microstructure of Thin $LiNbO_3$ Films Prepared by Sol-Gel Process", J. Mater. Res., 2(5), Sep./Oct. 1987, pp. 595-605.

Primary Examiner—Michael Lewis
Assistant Examiner—Steven Bos

[57] ABSTRACT

A sol-gel process is disclosed for preparing $MTiOXO_4$ when M is K, Rb, Tl and/or $NH_4$ and X is P and/or As which involves dissolving suitable compounds of M, Ti and X in stoichiometic amounts in a suitable organic liquid, and then producing crystalline $MTiOXO_4$ using procedures including hydrolysis, condensation, solidification and pyrolysis. Bulk material and films (e.g., films of KTP on a single crystal silicon substrate) may be produced. Compositions comprising films of said $MTiOXO_4$ produced by this process are disclosed.

9 Claims, No Drawings

OPTICALLY USEFUL COMPOSITIONS AND A SOL-GEL PROCESS FOR THEIR PRODUCTION

FIELD OF THE INVENTION

This invention relates to producing optically useful $KTiOPO_4$ and certain analogs thereof, including processes for producing such materials from precursor solutions.

BACKGROUND OF THE INVENTION

Potassium titanyl phosphate and certain of its analogs are non-linear optical materials, and are being investigated for a number of non-linear optical applications (see e.g., U.S. Pat. No. 3,949,323). Applications range from frequency doubling the 1 μm radiation of Nd lasers to various electro-optic applications, such as modulators and Q switches. The use of these materials for forming waveguides is illustrated in U.S. Pat. No. 4,740,265 and U.S. Pat. No. 4,766,954. Recently, low loss optical waveguides of KTP have been developed for integrated-optic applications. Most of the above applications are based on the use of single crystal KTP.

Processes for producing optical quality crystals of $KTiOP_4$ (KTP) and its analogs using aqueous systems are known generally in the art as hydrothermal processes (see e.g., U.S. Pat. No. 4,305,778) and processes for producing such crystals using nonaqueous molten salt systems are known generally in the art as flux processes (see e.g., U.S. Pat. No., 4,231,838). Typically, hydrothermal processes are run at elevated temperature and pressure and involve growing the crystal in a vessel having a growth region where the crystal grows and a nutrient region containing nutrient for growing the crystal, and employ an aqueous mineralization solution. U.S. Pat. No. 5,066,356 describes a hydrothermal process for growing optical-quality single crystals at reduced temperature and pressure conditions.

U S. Pat. No. 5,039,187 discloses a process for the liquid phase epitaxial growth of a thin film of certain KTP analogs on a substrate.

Sol-gel technology is well known in the art for fabricating a wide variety of glasses, fibers and films. The technique generally involves forming a solution of predetermined hydrolyzable components, at least partially hydrolyzing the components by the addition of water, then heat treating the solution to drive off the resulting alcohols, residual solvent and water to form a shaped, substantially homogeneous solid composition. Successful sol-gel processes typically offer the advantage of allowing use of relatively pure precursor materials, and selectively low temperatures, while providing a relatively homogeneous mix of components (see e.g., D. C. Bradley, Chem. Rev., 89, pp. 1317-1322 (1989)). The most common material to which this technology has been successfully applied is silica. Porous silica glass made by sol-gel methods has been further treated with various dopants, prior to hydrolysis and densification to form optical waveguides (Kondo et. al., Japanese Journal of Applied Physics, Part 1, Vol. 29, No. 12, pp. 2868-2874 (Dec. 1990)).

The majority of known sol-gel systems involve utilization of only one hydrolyzable components in the starting solution (see, e.g., L. L. Hench et. al., Chem, Rev 90(1), pp. 33-72 (1990)). Such systems allow for relatively predictable chemistry and manipulation of the reaction conditions. Multicomponent sol-gel systems (i.e., those processes using more than one hydrolyzable component in the starting solution) are less common. (See, e.g., U.S. Pat. No. 4,946,710.) Generally, the difficulty in achieving homogeneous products increases with the number of components.

Sol-gel processes have been developed for producing thin films of certain compositions. (See, e.g., U.S. Pat. No. 4,957,725.) The preparation of $LiNbP_3$ films by a sol-gel process is described in D. P. Partlow et. al., J. Mater. Res., 2(5), pp. 595-605 (1987).

SUMMARY OF THE INVENTION

This invention provides a sol-gel process for preparing crystalline $MTiOXO_4$, wherein M is selected from the group consisting of K, Rb, Tl, $NH_4$ and mixtures thereof, and X is selected from the group consisting of P, As and mixtures thereof. The process comprises the steps of (1) dissolving in an organic liquid at least one M-containing compound of the formula $MOR^1$, at least one Ti-containing compound of the formula $Ti(OR^2)_4$, and at least one X-containing compound selected from the group consisting of compounds having the formula $OX(OH)(OR^3)_2$, compounds having the formula $OX(OH)_2(OR^4)$ and compounds having the formula $OX(OR^5)_3$ (wherein M and X are as described above) wherein each $R^1$, $R^2$, $R^3$, $R^4$ and $R^5$ is independently selected from the group consisting of branched and straight chained alkyl groups having from 1 to 10 carbon atoms and aryl and alkyl substituted aryl groups having from 6 to 16 carbon atoms, to provide a solution wherein the atom ratio M:Ti:X is about 1:1:1; (2) adding to the solution obtained from step (1) sufficient water for hydrolysis and condensation reactions involving said dissolved compounds and providing a temperature suitable for said hydrolysis and condensation to obtain a substantially clear solution; (3) vaporizing solution liquid from the clear solution obtained in step (3) to form a substantially homogeneous solid; and (4) heating the solid formed in step (3) to a temperature of at least about 700° C. in an oxygen-containing atmosphere to form crystalline $MTiOXO_4$; provided that when an X-containing compound dissolved in step (1) is $OX(OR^5)_3$, $R^5$ is selected such that said X-containing compound is not volatile under process conditions.

The process is useful for preparing bulk $MTiOXO_4$. A continuous, substantially crack-free film of crystalline $MTiOXO_4$ on a substrate may be prepared using the above process by applying a coat of the clear solution obtained in step (2) onto a rigid substrate (e.g., single crystal silicon) prior to forming the homogeneous solid in step (3). Novel compositions comprising films are provided by this process; and compositions are provided which comprise a substrate and a film of $MTiOXO_4$ formed thereon using this process.

DETAILED DESCRIPTION

The process of this invention for preparing $MTiOXO_4$ (where M is selected from the group consisting of potassium, rubidium, thallium, ammonium and mixtures thereof and X is selected from the group consisting of phosphorous, arsenic and mixtures thereof) involves dissolving suitable compounds comprising M, Ti and X in stoichiometric amounts in a suitable organic liquid, and then producing crystalline $MTiOXO_4$ using procedures including hydrolysis, condensation, solidification and pyrolysis (i.e., calcination). Compounds are disclosed in connection with this invention which are suitable for use in sol-gel processes of this type.

Suitable compounds comprising M include compounds having the formula $MOR^1$ where $R^1$ is selected from the group consisting of branched and straight chain alkyl groups having from 1 to 10 carbon atoms and aryl and alkyl substituted aryl groups having from 6 to 16 carbon atoms. Preferred $R^1$ groups include alkyl groups having from 1 to 3 carbon atoms. Ethyl is especially preferred. Suitable compounds comprising Ti include compounds having the formula $Ti(OR^2)_4$ where each $R^2$ is independently selected from the group consisting of branched and straight chain alkyl groups having from 1 to 10 carbon atoms and aryl and alkyl substituted aryl groups having from 6 to 16 carbon atoms. Preferred $R^2$ groups include alkyl groups having from 1 to 5 carbon atoms. Isopropyl is especially preferred.

Suitable compounds comprising X include compounds of the formula $OX(OH)(OR^3)_2$ and compounds of the formula $OX(OH)_2(OR^4)$ wherein $R^3$ and $R^4$ is independently selected from the group consisting of branched and straight chain alkyl groups having from 1 to 10 carbon atoms and aryl and alkyl substituted aryl having from 6 to 16 carbon atoms. Preferred R4 groups include alkyl groups having from 1 to 5 carbon atoms. Isopropyl and sec-butyl are especially preferred.

Certain compounds comprising X of the formula $OX(OR^5)_3$ wherein each $R^5$ is independently selected from the group consisting of branched and straight chain alkyl groups having from 1 to 10 carbon atoms and aryl and alkyl substituted aryl having from 6 to 16 carbon atoms are also considered suitable for use. However, as some of these compounds (e.g., compounds where X is P and each $R^5$ is ether methyl, ethyl or phenyl are considered sufficiently volatile) result in loss of X using standard preparation methods. Accordingly, methods of controlling volatility are considered necessary if such compounds are to be employed during preparation. However, compounds of the formula $OX(OR^5)_3$ wherein each $R^5$ is selected such that the compound is nonvolatile are considered more suitable for use in this invention. Nevertheless, compounds of the formula $OX(OH)(OR^3)_2$ and compounds of the formula $OX(OH)_2 (OR^4)$ are preferred. Preferably X is P. The choice of a phosphorous source is considered particularly important. For example, phosphoric acid has been found to form precipitates (e.g., insoluble potassium phosphates). A compound of the formula $OP(OC_2H_5)_3$ has been found to yield materials which are non-stoichiometric and poor in phosphorous. It is believed this was due to volatilization of the phosphoester.

Normally the compounds are dissolved in the organic liquid to provide a molar ratio of M:Ti:X in solution of about 1:1:1.

Any organic solvent capable of dissolving the desired M-containing, Ti-containing and X-containing compounds and having at least some miscibility with water may be utilized in this process. Organic liquids suitable for use as solvents for the solution of compounds comprising M, Ti and X include alcohols such as methanol, ethanol, and isopropanol and polar solvents such as dimethylformamide (i.e., DMF), dimethylacetamide (i.e., DMAC), acetonitrile (i.e., $CH_3CN$), and tetrahydrofuran (i.e., THF). Isopropanol is a preferred solvent.

After the compounds comprising M, Ti and X are dissolved in the organic liquid, sufficient water is added for at least partial hydrolysis of dissolved compounds and condensation of corresponding hydrolysis products, and a suitable temperature for said hydrolysis and condensation is provided. Suitable temperatures are typically within the range of 20° C. to 100° C. A substantially clear solution (i.e., sol) is obtained.

Solution liquid is then vaporized from the homogeneous sol to form a solid. Heat may be provided to accellerate evaporation of solution liquid. Typically, as the solution liquid evaporates, a clear solid glass is formed. The solid is then heated in an oxygen-containing atmosphere (e.g., air) to a temperature of at least about 700° C. to form crystalline $MTiOXO_4$. Preferred pyrolysis temperatures are in the range of about 700° C. to about 850° C. Bulk $MTiOXO_4$ may be obtained by vaporizing liquid from a container of homogeneous sol, and pyrolyzing the resulting solid Compositions comprising films are also provided in accordance with this invention. A film of $MTiOXO_4$ may be provided by applying the homogeneous sol to a suitable substrate prior to forming the homogeneous solid. Typically, solution liquids such as isopropanol will readily vaporize at room temperature to form the solid from a thin substrate coating.

The substrate may be any solid which is not destroyed by process conditions, and is preferably non-porous. For the formation of continuous, substantially crack-free films, a rigid substrate is desirable. Suitable substrates include solid silicas (e.g., quartz), silicon, $KTiOPO_4$, $LaALO_3$, $MgO$, $SrTiO_3$ and metallic tungsten. Single crystals of crystalline material such as silicon, $KTiOPO_4$, $LaAlO_3$, $MgO$ and $SrTiO_3$ are considered particularly suited as substrates for films of $MTiOXO_4$. provided by this invention.

The sol may be applied to the substrate by any method which provides a substantially uniform coating. For example the substrate may be dipped into the homogeneous sol and withdrawn in a manner which achieves a coating of substantially uniform thickness. Spin coating is considered a particularly suitable method of applying the sol to the substrate. Typically, spin coating can be used to provide a film layer having a thickness of about 0.1 $\mu$m (1000Å). This invention thus provides compositions comprising a substrate and a film of $MTiOXO_4$ produced by the sol-gel process described herein.

Multiple coatings may be applied to achieve a film having multiple layers. For example, a substrate having a 0.1 $\mu$m film of $MTiOXO_4$ may be spin coated to provide an additional layer. Films including layers of different materials are within the scope of this invention (e.g., a silicon single crystal may have alternating layers of $KTiOP_4$ and $RbTiOPO_4$).

The films of this invention include continuous films with thicknesses within the range of from about 0.05 to about 25 $\mu$m, or more. Preferably, for waveguiding the film thickness is at least about 0.2 $\mu$m, most preferably at least about 0.5 $\mu$m. Films of various thicknesses can be obtained by adjusting the solution concentrations, the amount of solution coated onto a substrate and/or the number of layers of film applied.

Practice of the invention will become further apparent from the following non-limiting examples.

EXAMPLE 1

Inside a nitrogen box, 200 ml of isopropanol was placed into a 500 ml round bottom flask. While stirring, 11.36 g of titanium isopropoxide $Ti(OC_3H_7)_4$, 3.37 g of potassium ethoxide $K(OC_2H_5)$ and 7.6 g of n-butyl acid phosphate $[CH_3(CH_2)_3O]_2P(O)_2OH/-[CH_3(CH_2)_3O]-PO(OH)_2$, a 1:1 mixture, was added. A clear yellow solution resulted. To this solution was added 2.88 g of distilled water, which is equal to 4.0 mole equivalents per titanium in 20 mls of isopropanol. The water/isopropanol mixture was added slowly to the yellow solution with stirring over a period of about 30 min. This solution was allowed to stand overnight.

EXAMPLE 2

Approximately 60 mls of the clear yellow solution prepared in Example 1 was placed in an open beaker. The beaker and contents were placed in an oven at 75° C. and the solvent was left to evaporate overnight. This resulted in the formation of a clear and glass-like solid. This glass-like appearance was typical of solgel derived materials. No visual evidence for multiple phases was found. The solid was then treated at different temperatures ranging from 500° C. to 1000° C. for periods of 10 h in air. Powder diffraction revealed that the resulting powder was amorphous at 500° C. but crystallized at both 750° C. and 1000° C. to form crystalline potassium titanyl phosphate, which appeared phase pure.

A sample of the powder which was calcined at 750° C. was measured to see if it exhibits SHG properties (second harmonic generation). The powder exhibited typical SHG properties as found for KTP (i.e., about 1000 times better than quartz).

EXAMPLE 3

5 ml of the precursor solution prepared in Example 1, was diluted with an equal volume of isopropanol. The solution was placed in a sealed vial and placed in an oven overnight at 60° C. to ensure complete hydrolysis. This was filtered through a 0.46 μm filter to remove small particulates. This solution was then spin coated onto a polycrystalline silica substrate. Approximately 1–2 mls of spinning solution was placed on the substrate to cover the substrate and the substrate was spun at 750 rpm for 15 sec, followed by 2000 rpm for two minutes. This resulted in a clear and crack-free film. The film and substrate were placed in the furnace and heated at 10° C. per minute to 750° C., held at 750° C. for 10 minutes, and then cooled to room temperature. The resulting films are crystalline as shown by X-ray diffraction with diffraction peaks which correspond exactly to that of KTP. The films appeared uniform and clear and there was no evidence of cracking.

EXAMPLE 4

The process as described in Example 3 was repeated except that the substrates of single crystal Si, KTP and LaALO$_3$ were used. The film thickness of a single spin followed by calcination as determined by electron microscopy and ellipsometry for the single crystal silicon substrate was about 1000Å.

EXAMPLE 5

The process of Example 3 was repeated a total of five times to give a final film thickness of about 5000Å. Following the last coating and heating to 750° C., the film was heated at 750° C. for 10 hrs. A film about 5000Å thick was used to test for waveguiding. Waveguiding with 1 mode was found.

Particular embodiments of the invention are included in the examples. Other embodiments will become apparent to those skilled in the art from a consideration of the specification or practice of the invention disclosed herein. It is understood that modifications and variations may be practical without departing from the spirit and scope of the novel concepts of this invention. It is further understood that the invention is not confined to the particular formulations and examples herein illustrated, but it embraces such modified forms thereof as come within the scope of the following claims.

What is claimed is:

1. A process for preparing MTiOXO$_4$ wherein M is selected from the group consisting of K, Rb, Tl, NH$_4$ and mixtures thereof and X is selected from the group consisting of P, As and mixtures thereof, comprising the steps of:

(1) dissolving in an organic liquid at least one M-containing compound of the formula MOR$^1$, at least one Ti-containing compound of the formula Ti(OR$^2$)$_4$, and at least one X-containing compound selected from the group consisting of compounds having the formula OX(OH) (OR$^3$)$_2$; compounds having the formula OX(OH)$_2$(OR$^4$) and compounds having the formula OX(OR$^5$)$_3$, wherein M and X are as described above, and wherein each R$^1$, R$^2$, R$^3$, R$^4$ and R$^5$ is independently selected from the group consisting of branched and straight chained alkyl groups having from 1 to 10 carbon atoms and aryl and alkyl substituted aryl groups having from 6 to 16 carbon atoms, to provide a solution wherein the atom ratio M:Ti:X is about 1:1:1, (2) adding to the solution obtained from step (1) sufficient water for hydrolysis and condensation reactions involving said compounds dissolved in step (1), and providing a temperature suitable for said hydrolysis and condensation to obtain a substantially clear solution;

(3) vaporizing solution liquid from the clear solution obtained in step (3) to form a substantially homogeneous solid; and (4) heating the solid formed in step (3) to a temperature of at least about 700° C. in an oxygen-containing atmosphere to form crystalline MTiOXO$_4$; provided that when a X-containing compound dissolved in step (1) OX(OR$^5$)$_3$, R$^5$ is selected such that said X-containing compound is not volatile during process step (1) through process step (4).

2. The process of claim 1 wherein X is P.

3. The process of claim 2 wherein M is X.

4. The process of claim 1 wherein a coat of the clear solution obtained is step (2) is applied onto a rigid substrate prior to vaporizing the solution liquid in step (3) to form a continuous film of crystalline MTiOXO$_4$.

5. The process of claim 4 wherein the film consists essentially of crack-free crystalline MTiOXO$_4$.

6. The process of claim 5 wherein the substrate is quartz, metallic tungsten, or a single crystal of silicon, KTiOPO$_4$, LaAlO$_3$, MgO or SrTiO$_3$.

7. The process of claim 5 wherein multiple layers of film are applied.

8. The process of claim 5 wherein X is P.

9. The process of claim 1, claim 2, claim 3, claim 4, claim 5, claim 6 or claim 8 wherein the at least one X-containing compound is selected from the group consisting of compounds having the formula OX(OH)(OR$^3$)$_2$ and compounds having the formula OX(OH)$_2$(OR$^4$): wherein R$^1$ is selected from alkyl groups having from 1 to 3 carbon atoms; and wherein R$^2$, R$^3$ and R$^4$ are selected from alkyl groups having from 1 to 5 carbon atoms.

* * * * *